US006297148B1

(12) United States Patent
Besser et al.

(10) Patent No.: US 6,297,148 B1
(45) Date of Patent: Oct. 2, 2001

(54) METHOD OF FORMING A SILICON BOTTOM ANTI-REFLECTIVE COATING WITH REDUCED JUNCTION LEAKAGE DURING SALICIDATION

(75) Inventors: Paul Besser, Austin, TX (US); Minh Van Ngo, Fremont; Yowjuang Bill Liu, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/477,808

(22) Filed: Jan. 5, 2000

Related U.S. Application Data
(60) Provisional application No. 60/149,480, filed on Aug. 19, 1999.

(51) Int. Cl.[7] .............................................. H01L 21/4763
(52) U.S. Cl. ........................................... 438/636; 438/778
(58) Field of Search ..................................... 438/636, 630, 438/648, 649, 651, 655, 663, 664, 682, 683, 592, 778, 786

(56) References Cited

U.S. PATENT DOCUMENTS

| 5,973,372 | * | 11/1999 | Omid-Zohoor et al. | 257/383 |
| 5,994,191 | * | 11/1999 | Xiang et al. | 438/300 |
| 6,015,752 | * | 1/2000 | Xiang et al. | 438/655 |
| 6,124,217 | * | 9/2000 | Sun et al. | 438/778 |
| 6,150,243 | * | 11/2000 | Wieczorek et al. | 438/558 |

FOREIGN PATENT DOCUMENTS 0 651 076 A1   5/1995   (EP) .

OTHER PUBLICATIONS

The National Technology Roadmap for Semiconductors—Table 29 Priority of Surface Preparation Technology Needs—pp. 118–121.
Ultra Shallow Junction Formation Using Diffusion from Silicides: J. Electrochem. Soc., vol. 139 No. 1, Jan. 1992 –H. Jiang, C. M. Osburn, P. Smith, Z–G. Xiao, D. Griffis, G. McGuire and G. A. Rozgony—pp. 196–218.

* cited by examiner

Primary Examiner—David Nelms
Assistant Examiner—Quoc Hoang

(57) ABSTRACT

A method of performing ultra-shallow junctions in a semiconductor wafer uses a silicon layer to achieve ultra-low silicon consumption during a salicide formation process. A refractory metal layer, such as a cobalt layer, is deposited over the gate and source/drain junctions of the semiconductor device. After a rapid thermal annealing is performed to form the high-ohmic phase of the salicide, a silicon layer is deposited at a low temperature over the semiconductor device. The silicon layer provides a source of silicon for consumption during a second thermal annealing step, reducing the amount of silicon of the source/drain junctions that is consumed. The second thermal annealing step is performed in a nitrogen and oxygen atmosphere so at the silicon layer is transformed into a silicon oxynitride bottom anti-reflective coating layer.

12 Claims, 3 Drawing Sheets

US 6,297,148 B1

METHOD OF FORMING A SILICON BOTTOM ANTI-REFLECTIVE COATING WITH REDUCED JUNCTION LEAKAGE DURING SALICIDATION

RELATED APPLICATIONS

This application claims benefit of Provisional Application No. 60/149,480 filed Aug. 19, 1999.

FIELD OF THE INVENTION

The present invention relates to the field of semiconductor device manufacturing, and more particularly, to the formation of low resistivity self-aligned silicide ("salicide") regions on the gate and source/drain junctions with an ultra-low silicon consumption, and a silicon bottom anti reflective coating.

BACKGROUND OF THE INVENTION

In the manufacture of integrated circuits, a commonly used practice is to form silicide on source/drain regions and on polysilicon gates. This practice has become increasingly important for very high density devices where the feature size is reduced to a fraction of a micrometer. Silicide provides good ohmic contact, reduces the sheet resistivity of source/drain regions and polysilicon gates, increases the effective contact area, and provides an etch stop. A common technique employed in the semiconductor manufacturing industry is the self-aligned silicide ("salicide") processing period. Salicide processing involves the deposition of a metal that forms intermetallic with silicon (Si), but does not react with silicon oxide or silicon nitride. Common metals employed in salicide processing are titanium (Ti), cobalt (Co), and nickel (Ni). These common metals form low resistivity phases with silicon, such as $TiSi_2$, $CoSi_2$, NiSi. The metal is deposited with a uniform thickness across the entire semiconductor wafer. This is accomplished using, for example, physical vapor deposition (PVD) from an ultra-pure sputtering target and a commercially available ultra-high vacuum (UHV), multi-chamber, DC magnetron sputtering system. Deposition is performed after both gate etch and source/drain junction formation. After deposition, the metal blankets the polysilicon gate electrode, the oxide spacers, the oxide isolation, and the exposed source and drain electrodes. A cross section of an exemplary semiconductor wafer during one stage of a salicide formation process in accordance with the prior art techniques is depicted in FIG. 1.

As shown in FIG. 1, a silicon substrate 10 has been provided with the source/drain junctions 12, 14 and a polysilicon gate 16. Oxide spacers 18 have been formed on the sides of the polysilicon gate 16. The refractory metal layer 20 has been blanket deposited over the source/drain junctions 12, 14, the polysilicon gate 16 and the spacers 18. The metal layer 20 also blankets oxide isolation regions 22 that isolate the devices from one another.

A first rapid thermal anneal (RTA) step is then performed at a temperature of between 450°–700° C. for a short period of time in a nitrogen atmosphere. The nitrogen reacts to form a metal nitride at the surface of the metal, while the metal reacts with silicon and forms silicide in those regions where it comes in direct contact with the silicon. Hence, the reaction of the metal with the silicon forms a silicide 24 on the gate 16 and source/drain regions 12, 14, as depicted in FIG. 2. After the first rapid thermal anneal step, any metal that is unreacted is stripped away using a wet etch process that is selective to the silicide. The second, higher temperature rapid thermal anneal step, for example above 700° C., is applied to form a lower resistance silicide phase of the metal silicide. The resulting structure is depicted in FIG. 3 in which the higher resistivity metal silicide 24 has been transformed to the lowest resistivity phase metal silicide 26. For example, when the metal is cobalt, the higher resistivity phase is CoSi and the lowest resistivity phase is $CoSi_2$. When the polysilicon and diffusion patterns are both exposed to the metal, the silicide forms simultaneously over both regions so that this method is described as "salicide" since the silicides formed over the polysilicon and single-crystal silicon are self-aligned to each other.

Titanium is currently the most prevalent metal used in the integrated circuit industry, largely because titanium is already employed in other areas such as 0.5 micron CMOS logic technologies. In the first rapid thermal anneal step, the so-called "C49" crystallographic titanium phase is formed, and the lower resistance "C54" phase forms during the second rapid thermal anneal step. However, the titanium silicide sheet resistance rises dramatically due to narrow-line effects. This is described in European publication number 0651076. Cobalt silicide ($CoSi_2$) has therefore been introduced by several integrated circuit manufacturers as the replacement for titanium silicide. Since cobalt silicide forms by a diffusion reaction, it does not display the narrow-line effects observed with titanium silicide that forms by nucleation-and-growth. Some of the other advantages of cobalt over alternative materials such as titanium, platinum, or palladium are that cobalt silicide provides low resistivity, allows lower-temperature processing, and has a reduced tendency for forming diode-like interfaces.

One of the concerns associated with cobalt silicide technologies is that of junction leakage, which occurs when cobalt silicide is formed such that it extends to the bottom and beyond of the source and drain junctions. An example of this occurrence is depicted in FIG. 3. A source of this problem is the high silicon consumption during the salicide formation process. One way to account for the high consumption of silicon during salicide processing is to make the junctions deeper. Making the junctions deeper, however, is counter to the desire for extremely shallow source and drain junctions that support device scaling, and negatively impacts device performance.

SUMMARY OF THE INVENTION

There is a need for a method of producing ultra-shallow junctions and forming salicide in a manner that reduces the amount of silicon consumed in the junctions.

This and other needs are met by embodiments of the present invention which provide a method of forming an anti-reflective coating (ARC) and silicide regions in a semiconductor device. The method comprises the steps of forming a semiconductor device having active regions and a gate. A refractory metal layer is deposited over the device. Annealing is then performed to cause portions of the refractory metal layer to react with the active regions and the gate to form higher resistivity phase silicide regions in the active regions and the gate. A silicon layer is then deposited over the device. This is followed by annealing in a nitrogen and oxygen atmosphere so as to transform the higher resistivity phase silicide regions into lower resistivity phase silicide regions. The silicon from the silicon layer is consumed by the higher resistivity phase silicide region during the forming of the lower resistivity phase silicide region. At the same time, a silicon oxynitride ARC layer is formed by causing the silicon layer to incorporate the nitrogen and oxygen from the nitrogen and oxygen atmosphere.

Some of the advantages of the present invention include the dual use of a silicon layer to provide silicon to be consumed during the transformation of the silicide regions from a higher resistivity phase to a lower resistivity phase, but at the same time, to be used to form a silicon oxynitride ARC layer. Hence, this silicon layer serves a dual purpose so that the final device will contain ultra-shallow junctions and a silicon oxynitride ARC layer.

The earlier stated needs are also met by another embodiment of the present invention which provides a method of simultaneously forming a silicide in an anti-reflective coating on a semiconductor device. The silicon layer is deposited over higher resistivity phase silicide regions of a semiconductor device. Annealing is performed in a nitrogen and oxygen atmosphere to cause the higher resistivity phase silicide regions to consume silicon from the silicon layer that is transformed to lower resistivity phase silicide regions. This annealing causes the silicon layer to also simultaneously incorporate nitrogen and oxygen to transform the silicon layer into a silicon oxynitride anti-reflective coating.

The earlier stated needs are also met by a semiconductor device with ultra-shallow junctions, comprising device junctions having a depth of between about 800 and about 1500 Angstroms. The device includes lower resistivity phase silicide regions of between about 300 and about 600 Angstroms on the device junctions. A silicon oxynitride anti-reflective coating layer of between about 200 and about 800 Angstroms thick is present on the silicide regions. According to certain embodiments of the present invention, the silicide regions include silicon consumed from the silicon oxynitride anti-reflective coating layer.

Additional features and advantages of the present invention will become readily apparent to those skilled in the art from the following detailed description, wherein embodiments of the present invention are described, simply by way of illustration of the best mode contemplated for carrying out the invention. As will be realized, the invention is capable of other and different embodiments and its several details are capable of modifications in various obvious respects, all without departing from the invention. Accordingly, the drawings and description are to be regarded as illustrative in nature, and not as restrictive.

DETAILED DESCRIPTION OF THE INVENTION

The present invention allows ultra-shallow junction formation simultaneously with low sheet-resistance salicide processing by reducing the amount of silicon consumed in the junctions during the formation of the salicide. At the same time, the present invention also forms a silicon oxynitride anti-reflective coating layer. These results were accomplished in the present invention through the provision of a silicon layer deposited at low temperatures over the semiconductor device after the higher resistivity phase silicide regions are formed. The silicon layer acts as a source of silicon for consumption by the higher resistivity phase silicide regions during a second annealing. This has the effect of reducing the amount of silicon consumed from the junctions themselves during this transformation. At the same time, by performing this annealing step in a nitrogen and oxygen atmosphere, the silicon layer is transformed into a silicon oxynitride ARC layer for later use in lithography at the local interconnect level.

Figure 1:
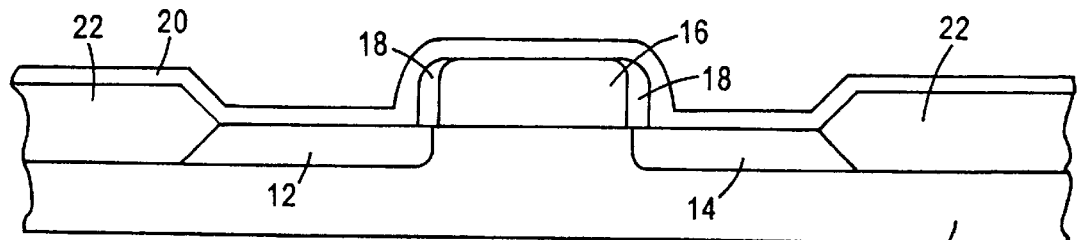
FIG. 1 is a cross-section of a portion of a semiconductor wafer processed in accordance with the prior art during one step of a salicide process.
Figure 2:
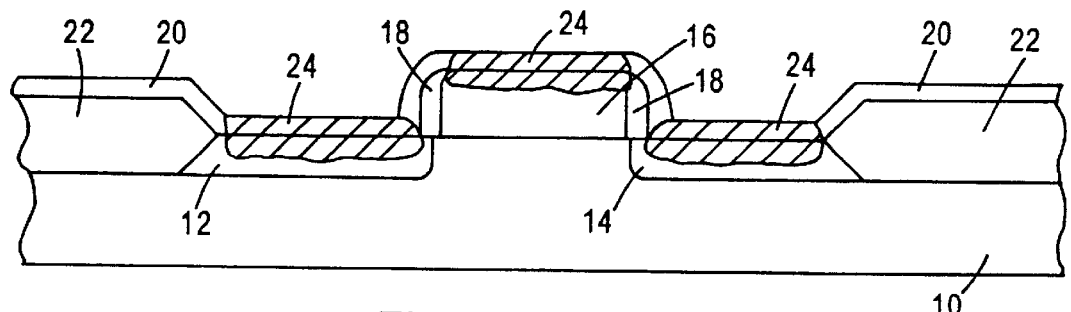
FIG. 2 depicts the cross-section of FIG. 1 after a first rapid thermal anneal step to form higher resistivity phase metal silicide regions in accordance with the prior art.
Figure 3:
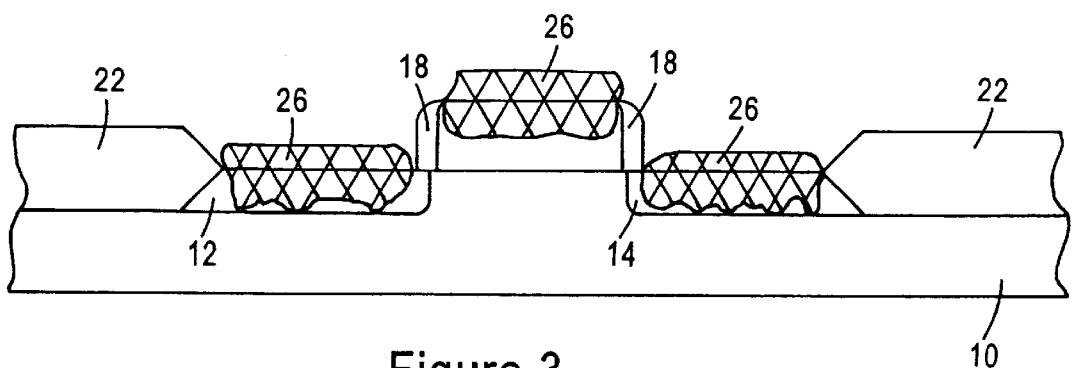
FIG. 3 is a cross-section of the semiconductor wafer of FIG. 2 following a second rapid thermal annealing step to form lower resistivity phase metal silicide regions in accordance with the prior art, depicting the high consumption of silicon in the substrate.
Figure 4:
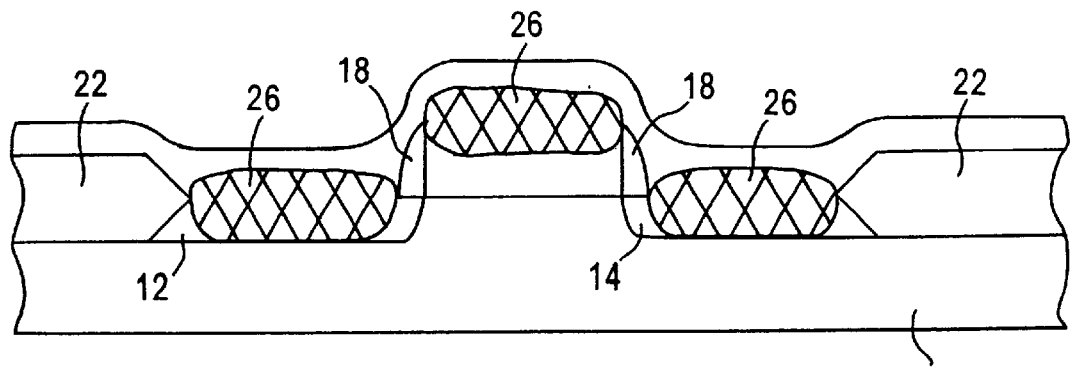
FIG. 4 is a cross-section of the semiconductor wafer of FIG. 3 following the deposition of a bottom anti-reflective coating layer in accordance with the prior art.

FIG. 4 is a depiction of a prior art arrangement in which the silicide regions have been formed as in the earlier described FIGS. 1–3. Junction spiking is present, since the silicon from the device junctions was consumed during the transformation from the high resistivity to the lower resistivity phase silicide. A silicon oxynitride ARC layer is deposited by conventional methodologies over the semiconductor layer for later use in lithography at the local interconnect level.

Figure 5:
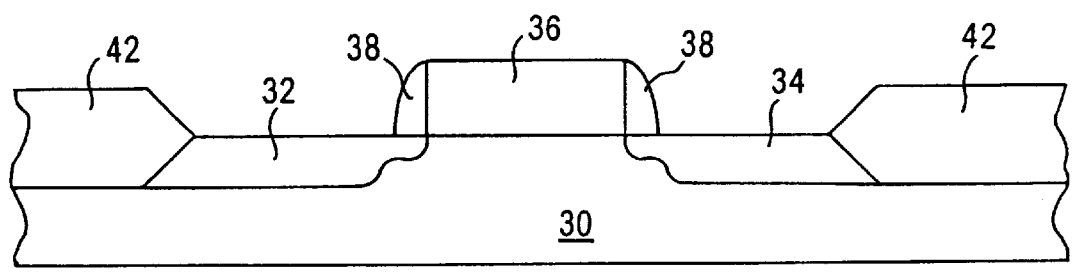
FIG. 5 is across-section of a portion of a semiconductor wafer prior to a salicidation process in accordance with embodiments of the present invention.

FIG. 5 is a cross-section of a semiconductor device on a semiconductor wafer on which low resistivity metal silicide regions will be formed in accordance with embodiments of the present invention. As with conventional semiconductor devices, a source junction 32 and a drain junction 34 are formed within a silicon substrate 30. A gate etch has produced a gate 36. Oxide (or nitride) spacers 38 are provided on the sides of the polysilicon gate electrode 36. Oxide isolation (such as LOCOS) regions 42 isolate individual semiconductor devices from each other.

Figure 6:
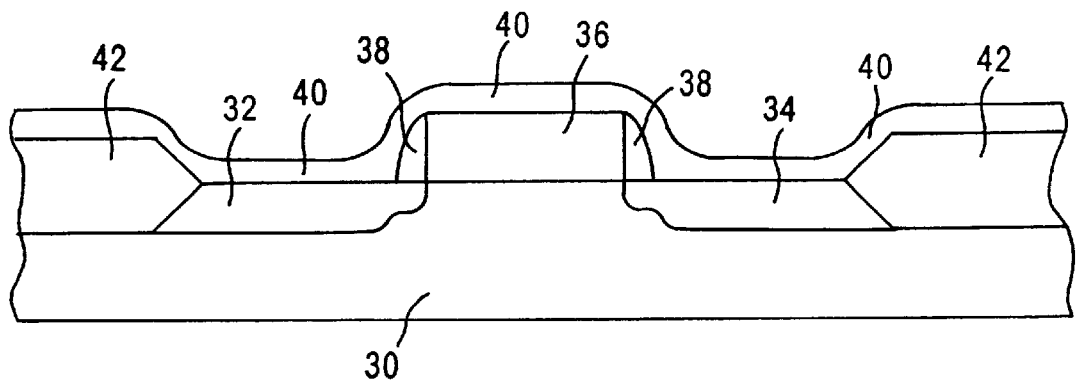
FIG. 6 is a depiction of the semiconductor device of FIG. 5, following the deposition of a refractory metal layer.

After the source and drain junctions 32, 34 have been formed, a refractory metal layer 40 is deposited uniformly across the entire wafer, as depicted in FIG. 6. This deposition is performed preferably using physical vapor deposition from an ultra-pure sputtering target and a commercially available ultra-high-vacuum, multi-chamber DC magnetron sputtering system. The thickness of the layer 40 is between about 50 to about 200 Angstroms in certain preferred embodiments.

The metal comprising the refractory metal layer in certain preferred embodiments is cobalt (Co). Cobalt has a number of advantages over other metals. For example, in comparison to cobalt silicide, titanium silicide sheet resistance rises dramatically due to narrow-line effects. Since the low resistivity phase of cobalt silicide forms by a diffusion reaction rather than nucleation-and-growth as in the low resistivity phase of titanium silicide, cobalt silicide has been introduced by several integrated circuit manufacturers as the replacement for titanium. However, the use of cobalt in layer 40 as a refractory metal is exemplary only. Another example of a metal that is the diffusing species in the first phase of a salicidation process is nickel (Ni).

Figure 7:
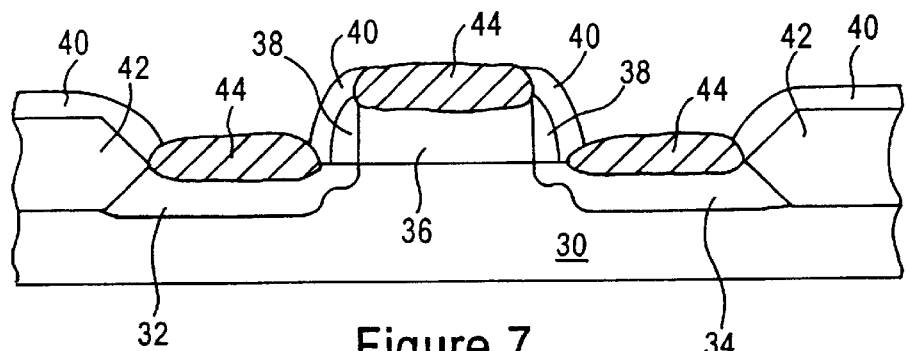
FIG. 7 is a depiction of the semiconductor device of FIG. 6, following a first rapid thermal annealing step to form initial, higher-ohmic phase of the salicide, in accordance with certain embodiments of the present invention.

FIG. 7 depicts the structure of FIG. 6 after the formation of high resistivity ("high-ohmic') metal silicide regions 44. In certain preferred embodiments, the high resistivity metal silicide regions 44 are created by a rapid thermal anneal step. The high resistivity silicide regions 44 may be made of cobalt silicide (CoSi), for example. The first rapid thermal annealing step may be performed by exposing the semiconductor wafer to a temperature between about 450° C. and about 600° C., and most preferably 500° C. The semiconductor wafer will be exposed for a relatively short time, for example, between about 5 and 90 seconds. As is apparent from FIG. 7, some of the silicon in the source and drain junctions 32, 34 is consumed during the first rapid thermal annealing step to become part of the high resistivity metal silicide regions 44. This is also true for the silicon and the polysilicon gate 36.

Figure 8:
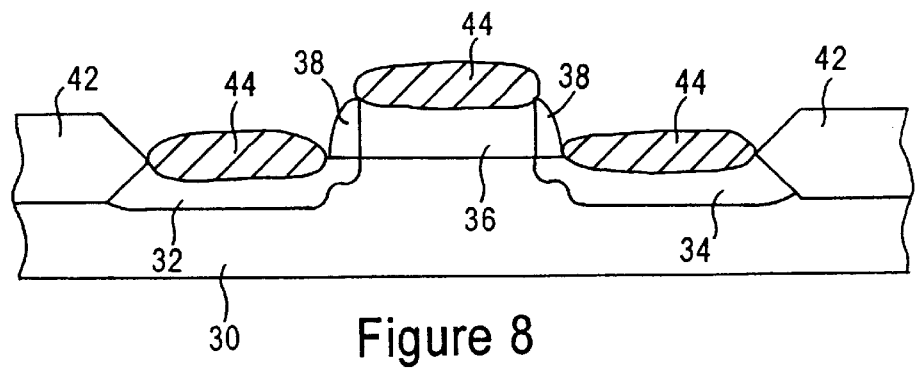
FIG. 8 is a depiction of the semiconductor device of FIG. 7, following the removal of unreacted refractory metal.

With the high resistivity metal silicide regions 44 formed, the unreacted cobalt or other metal of the metal layer 40 is removed. The unreacted metal that is removed is located over the field oxide regions 42 and the spacers 38. The unreacted metal may be removed by a selective etch. Typical etchants that are employed to remove unreacted cobalt include $3HCl:H_2O_2$ and $H_2SO_4:H_2O_2$. Removal of the unreacted metal by the peroxide solution leaves the high resistivity metal silicide regions 44 intact. The resultant structure is depicted in FIG. 8.

Figure 9:
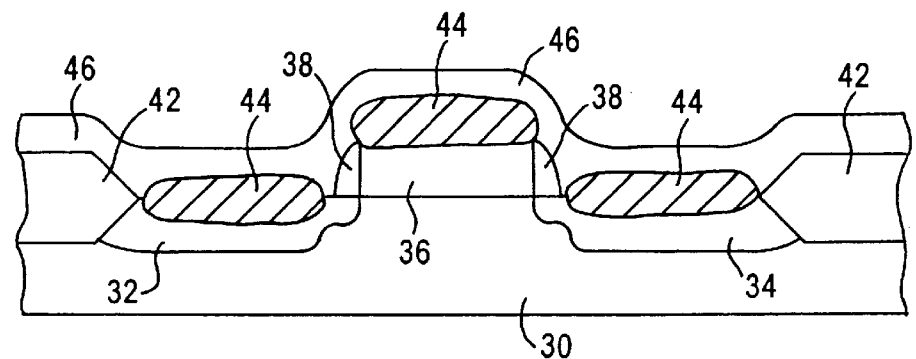
FIG. 9 depicts the semiconductor device of FIG. 8, following a low temperature deposition of a silicon layer over the semiconductor device.

Performing a second rapid thermal annealing step at this time would transform the high resistivity metal silicide regions 44 into lower resistivity metal silicide regions. However, doing so at this time would consume further silicon from a junction and create concerns regarding junction leakage caused by over-consumption of silicon. In order to provide a source of silicon for this transformation that is not already provided in the device junctions 32, 34, a layer of silicon 46 is conformally deposited over the semiconductor device. The resultant structure is depicted in FIG. 9. Silicon may be deposited in a number of different manners, such as physical vapor deposition (PVD), chemical vapor deposition (CVD) or plasma enhanced chemical vapor deposition (PECVD), for example. However, in each of these methods, the silicon needs to be deposited at a low temperature, e.g., less than about 450° C. Preferred temperatures for the deposition of the silicon layer is about 400° C. The thickness of the silicon layer may be about 800 Angstroms, although other thicknesses may be provided in accordance with the amount of silicon that will be consumed and the thickness of the silicon oxynitride ARC layer that is desired.

One reason for employing a low temperature deposition of the silicon layer is to prevent unintentional transformation of the high resistivity metal silicide regions 44 into low resistivity metal silicide regions during the deposition of the silicon layer. If these regions were to be transformed at this time, prior to the deposition of the silicon layer, the silicon from the source/drain junctions 32, 34 would be consumed, thereby limiting the shallowness achievable in the device junctions. Temperatures below approximately 450° C. will ensure that the transformation will not occur and silicon will not be consumed.

Figure 10:
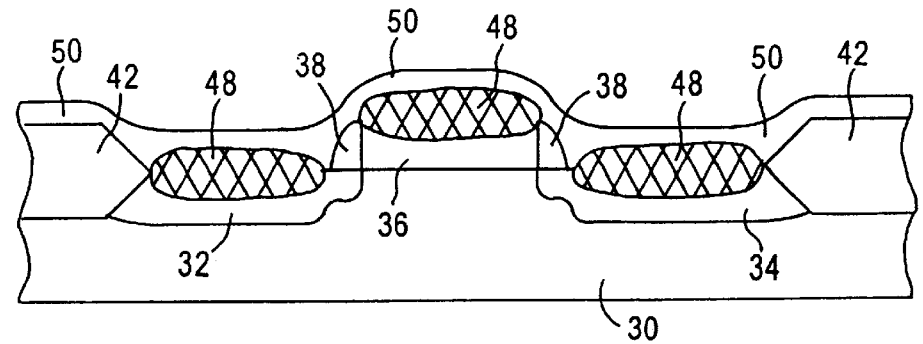
FIG. 10 is a depiction of the semiconductor device of FIG. 9 after a thermal annealing is performed to form lower resistivity phase metal silicide regions and a silicon oxynitride ARC layer, in accordance with certain embodiments of the present invention.

Once the silicon layer 46 has been deposited in the manner described above, the semiconductor device is subjected to a second rapid thermal annealing step to produce lower resistivity ("low-ohmic') metal silicide regions 48, such as $CoSi_2$, as depicted in FIG. 10. The second rapid thermal anneal step exposes the semiconductor wafer to a higher temperature than employed in the first rapid thermal anneal step, or the silicon layer deposition step. For example, the temperature in this second rapid thermal anneal step is between about 700° C. and about 850° C. The semiconductor wafer is exposed to the high temperature from between about 5 and about 90 seconds. During this second rapid thermal anneal step, the higher resistivity monosilicide (e.g. CoSi) is converted to lower resistivity disilicide (e.g. $CoSi_2$).

The second rapid thermal anneal step is performed, in preferred embodiments of the present invention, in a nitrogen and oxygen atmosphere. This allows the silicon layer of 46 to absorb or incorporate the oxygen and nitrogen from the atmosphere (e.g. the RTA ambient) to transform the silicon layer 46 into a silicon oxynitride layer 50. This silicon oxynitride 50 may then act as a bottom anti-reflective coating layer (BARC) for local interconnect lithography. As can be seen from this final structure, a device of ultra-shallow low junctions is provided with a silicon oxynitride BARC layer in an elegant and novel manner. The depths of the device junctions 32, 34 may be between about 800 and about 1500 Angstroms, while the low ohmic resistivity phase silicide regions 48 may have depths of between about 300 and about 600 Angstroms. The silicon oxynitride anti-reflective coating layer may be between about 200 and about 800 Angstroms thick on the silicide regions.

The embodiments of the present invention allow ultra-shallow junctions to be formed and employed in a semiconductor device with low resistivity salicide such as cobalt ($CoSi_2$), without compromising the advantages of either ultra-shallow junctions or low resistivity salicide. At the same time, a silicon oxynitride BARC layer is provided in a novel and advantageous manner. The exemplary embodiment has been described in which cobalt is employed as the refractory metal informing the salicide. However, the present invention finds utility in the other applications employing other materials that react with silicon to form a salicide, such as Ti, Pt, W or Ni.

Only certain preferred embodiments of the present invention and but a few examples of its versatility are shown and described in the present disclosure. It is to be understood that the present invention is capable of changes and modifications within the scope of the inventive concept as expressed herein.

What is claimed is:

1. A method of forming an antireflective coating (ARC) and silicide regions in a semiconductor device, comprising the steps of:

forming a semiconductor device having active regions and a gate;

depositing a refractory metal layer over the device;

annealing to cause portions of the refractory metal layer to react with the active regions and the gate to form higher resistivity phase silicide regions in the active regions and the gate;

depositing a silicon layer over the device; and annealing in a nitrogen and oxygen atmosphere so as to transform the higher resistivity phase silicide regions into lower resistivity phase silicide regions, with silicon from the silicon layer being consumed by the higher resistivity phase silicide regions during the forming of the lower resistivity phase silicide regions, and to form a silicon oxynitride ARC layer by causing the silicon layer to incorporate nitrogen and oxygen from the nitrogen and oxygen atmosphere.

2. The method of claim 1, wherein the step of annealing in a nitrogen and oxygen atmosphere includes subjecting the semiconductor device to a temperature of between about 700° C. to about 850° C.

3. The method of claim 2, wherein the step of depositing a silicon layer includes performing plasma vapor deposition at a temperature below about 250° C.

4. The method of claim 2, wherein the step of depositing a silicon layer includes performing chemical vapor deposition at a temperature below about 400° C.

5. The method of claim 2, wherein the step of depositing a silicon layer includes performing plasma enhanced chemical vapor deposition at a temperature below about 350° C.

6. The method of claim 1, wherein the refractory metal layer is one of cobalt, titanium, nickel.

7. A method of simultaneously forming a silicide and an antireflective coating on a semiconductor device, comprising the steps of:

depositing a silicon layer over high resistivity phase silicide regions of a semiconductor device; and annealing in a nitrogen and oxygen atmosphere to cause the high resistivity phase silicide regions to consume silicon from the silicon layer and transform to lower resistivity phase silicide regions, and simultaneously cause the silicon layer to incorporate nitrogen and oxygen to transform the silicon layer into a silicon oxynitride antireflective coating.

8. The method of claim 7, wherein the step of annealing in a nitrogen and oxygen atmosphere includes subjecting the semiconductor device to a temperature of between about 700° C. to about 850° C.

9. The method of claim 8, wherein the step of depositing a silicon layer includes performing plasma vapor deposition at a temperature below about 250° C.

10. The method of claim 8, wherein the step of depositing a silicon layer includes performing chemical vapor deposition at a temperature below about 400° C.

11. The method of claim 8, wherein the step of depositing a silicon layer includes performing plasma enhanced chemical vapor deposition at a temperature below about 350° C.

12. The method of claim 1, wherein the refractory metal layer is one of cobalt, titanium, nickel.

* * * * *